United States Patent [19]
McConnelee et al.

[11] Patent Number: 5,950,303
[45] Date of Patent: Sep. 14, 1999

[54] METHOD AND FIXTURING TO PERFORM TWO SIDE LAMINATIONS OF STACKED SUBSTRATES FORMING 3-D MODULES

[75] Inventors: Paul A. McConnelee, Schenectady; Richard J. Saia, Niskayuna; Kevin M. Durocher, Waterford, all of N.Y.

[73] Assignee: The United States of America as represented by the Secretary of the Air Force, Washington, D.C.

[21] Appl. No.: 09/056,043

[22] Filed: Apr. 3, 1998

[51] Int. Cl.[6] .................................................. H05K 3/36
[52] U.S. Cl. .............................. 29/830; 29/738; 324/760; 269/37
[58] Field of Search ............................... 29/600, 830, 732, 29/238, 738, 831; 324/760, 765; 269/152, 156, 37

[56] References Cited

U.S. PATENT DOCUMENTS

| | | | |
|---|---|---|---|
| 3,187,242 | 6/1965 | Schick | 317/261 |
| 3,769,702 | 11/1973 | Scarbrough | 29/830 |
| 3,949,274 | 4/1976 | Anacker | 317/101 A |
| 4,392,909 | 7/1983 | Bohn et al. | 156/306.9 |
| 4,506,442 | 3/1985 | Alzmann et al. | 29/830 |
| 4,683,653 | 8/1987 | Iwasa | 29/830 |
| 5,019,946 | 5/1991 | Eichelberger et al. | 361/414 |
| 5,316,602 | 5/1994 | Kogame et al. | 156/64 |
| 5,377,077 | 12/1994 | Burns | 361/704 |
| 5,641,371 | 6/1997 | Sanko | 156/228 |
| 5,886,535 | 3/1999 | Budnaitis | 324/760 |

FOREIGN PATENT DOCUMENTS

| | | | |
|---|---|---|---|
| 0163581 | 12/1985 | European Pat. Off. | 29/830 |
| 3240754 | 5/1983 | Germany | 29/830 |

*Primary Examiner*—Lee W. Young
*Assistant Examiner*—Minh Trinh
*Attorney, Agent, or Firm*—Robert L. Nathans

[57] ABSTRACT

A substrate stack is suspended within a stack holder to position upper and lower stack surfaces coplanar with upper and lower holder surfaces. Laminating heat and pressure is simultaneously applied to the upper and lower surfaces to laminate a carrier interconnect film to top and bottom stack portions simultaneously. Subsequent wet chemical processing of both stack edges may also be simultaneous to effect savings in manufacturing costs.

12 Claims, 1 Drawing Sheet

US 5,950,303

METHOD AND FIXTURING TO PERFORM TWO SIDE LAMINATIONS OF STACKED SUBSTRATES FORMING 3-D MODULES

STATEMENT OF GOVERNMENT INTEREST

This invention may be made by or for the Government for governmental purposes without the payment of any royalty thereon.

BACKGROUND OF THE INVENTION

The present invention relates to the field of high density interconnect (HDI) modules.

In order to build a three-dimensional (3-D) module, a substrate stack of two or more individual HDI substrates need to be interconnected by means of metallic interconnects that can extend over the substrate edges. In most designs, at least two edge portions of the substrates have to be interconnected. Since each 3-D stack edge requires the same HDI processing which includes lamination, via drilling, metallization and passivation, the initial lamination holder should expose and preferably laminate two edge portions of the stack to the conductive carrier interconnects simultaneously. If this is done, subsequent HDI processing using processing fluids can be performed in parallel rather than in series, saving processing time and reducing cost. For further background on the fabrication of 3-D modules from stacked substrates, reference can be made to U.S. Pat. No. 5,699,234 issued to Saia et al. FIG. 7 in particular discloses a laminating side layer 38 bonded to edge portions of the stack and bearing interconnects formed by wet processing after the laminating layer is bonded to the stack. This side layer thus constitutes an interconnect carrier film. See also U.S. Pat. No. 5,107,586 to Eichelberger et al.

It is desirable to provide a stack lamination holder for suspending the stack firmly in place during lamination and to expose two stack edges simultaneously to the heat and pressure of lamination. After the resulting lamination of the interconnect carrier film to the stack edge portions, the holder must prevent subsequently applied processing liquids from reaching interior portions of the stacked substrates within the holder during the wet chemical processing steps. It is also desirable to provide a process which can perform carrier film lamination upon wrap-around stack edge contacts without the production of voids.

BRIEF SUMMARY OF AN EMBODIMENT OF THE INVENTION

Thus, a method is provided for forming a three-dimensional module by providing a slotted stack holder for suspending the aforesaid substrate stack within the holder so that the holder has upper and lower surfaces coplanar with upper and lower stack edge portions, the stack edge portions and the holder surfaces being covered with first and second carrier interconnect sheets which are laminated to the stack edge portions and the holder surfaces by heat and pressure. Bolts, used to position and maintain the suspended stack within the holder slot, are removed after lamination, and the carrier interconnect sheets, now laminated to the stack edge portions, are further processed to cause plated interconnect layers among other things to be formed thereon. The holder enables simultaneous lamination of upper and lower edge portions of the stack to the carrier film, and suspends the stack within the holder slot during subsequent fluid processing used to deposit the electrical interconnects.

BRIEF DESCRIPTION OF THE DRAWINGS

Various features of the invention will be explained in further detail in the following description, taken in conjunction with the drawings in which.

DETAILED DESCRIPTION OF PREFERRED EMBODIMENTS OF THE INVENTION

Figure 1:
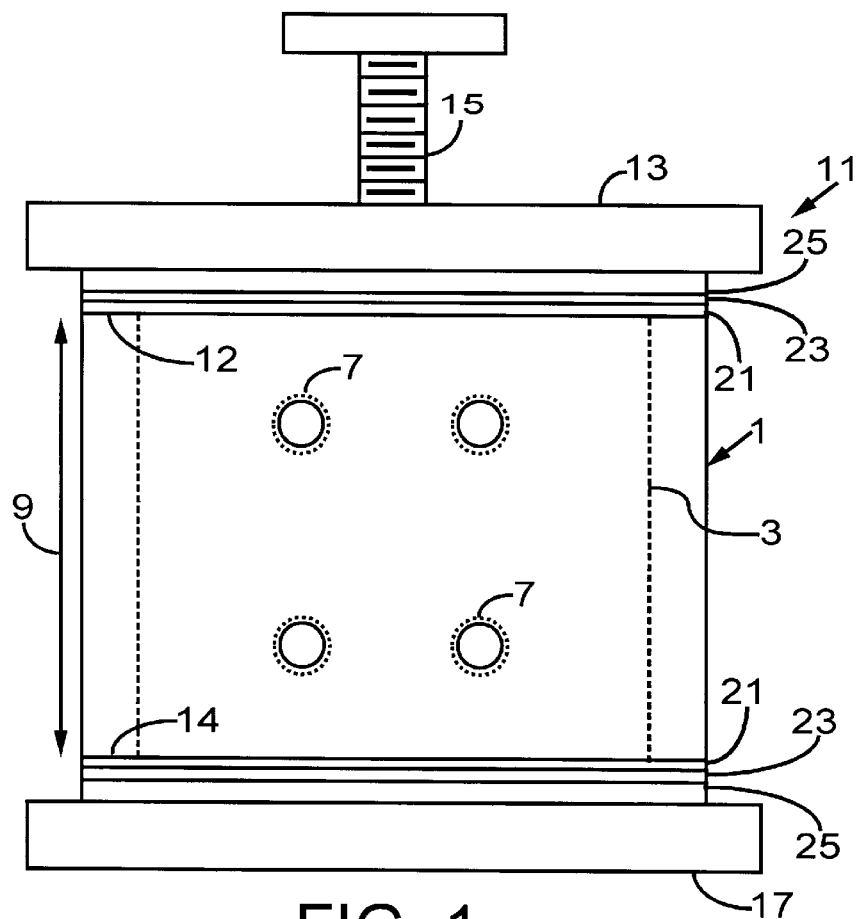
FIG. 1 illustrates the novel stack holder of the invention positioned within a laminator for laminating an interconnect carrier sheet to top and bottom edge portions of the stack supported within the stack holder by bolts.
Figure 3:
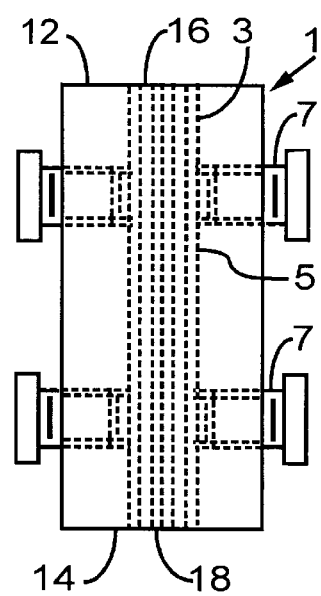
FIGS. 2 and 3 illustrate bottom and side views of the stack holder and substrate stack positioned within the laminator of FIG. 1.
Figure 2:
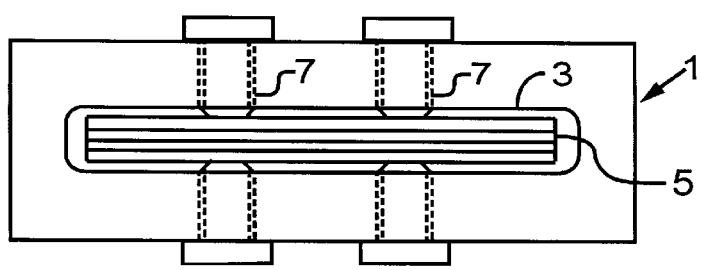

Referring now to the figures, a stack holder 1 having a slot 3 therein, has a set of bolts 7 for firmly suspending the aforesaid substrate stack 5 within the stack holder slot. Opposed upper and lower stack holder surfaces 12 and 14 are widely separated from each other by a distance 9, also equal to the distance between opposed stack top and bottom surfaces 16 and 18. Thus, the stack 5 is suspended firmly in place within the slot 3 to cause its first and second edge portions 16 and 18 to be coplanar with the upper and lower stack holder surfaces as 12 and 14 shown in FIGS. 2 and 3. The slot may also be termed an enclosed passageway extending all of the way through the stack holder 3.

First and second interconnect carrier sheets 23 are now positioned over edge portions of the stack holder with a very thin layer of heat activatable film 21 thereon, abutting the stack edges as shown. Laminator platen 13 is displaced in a downward direction by screw mechanism 15 to cause the stack holder 1 to be squeezed between heated pressure platens 13 and 17. Resilient pads 25 are provided to obtain good contact over irregular shaped substrate stack edges, providing void free laminations of the interconnect carrier sheets 23 to the stack edge portions.

After this lamination by the application of heat and pressure, bolts 7 are removed and the resulting bolt passageways are sealed by tape or otherwise to prevent processing fluids from entering the holder during further processing to detrimentally expose the stack substrates. The processing steps in part involve building up the interconnect electrical connector layers over the interconnect carrier sheets 23, and are disclosed in the aforesaid patents and references cited therein. Note that the bolts are no longer needed to firmly suspend the stack within the holder as the interconnect carrier sheets 23 are firmly bonded to the stack edge portions 16 and 18 and the coplanar stack holder surfaces 12 and 14. The carrier sheets also serve to prevent wet chemical processing fluids from entering the slot via the top and bottom stack holder slot portions.

In the actual reduction to practice of the invention, the holder was a solid titanium block, and electroplating tape was used to seal the bolt holes after lamination, and during the subsequent wet chemical processing. For post-lamination processing steps requiring a vacuum, the holes were left open for venting. The lamination carrier interconnect film 23 was one mil "Kapton HN". Glue layer 21, 0.5 mils, was SPI/Epoxy, 51% epoxy, was spun on the Kapton film, not the stack substrate edges, to prevent seepage of glue into the holder. The Kapton with glue was then baked at 100 degrees C. for 1.5 hours. The type of glue is not critical. Conformal cushion pads 25 were used to obtain good contact over irregular shaped substrate stack edges, which provided void free laminations. Also, this enables processing of substrates with wrap-round edge contacts. The laminator applied sixty psi to the top and bottom holder surfaces, the top and bottom laminating temperatures being 180 degrees F. and applied for 0.5 hours.

The parameters of the last paragraph are not believed to be critical and thus the scope of the invention is to be defined solely by the terms of the following claims and art recognized equivalents thereto.

What is claimed is:

1. Method of forming a three-dimensional module from a stack of two-dimensional substrates bearing electronic components comprising:

(a) providing a stack holder having a slot extending between first and second widely separated holder surfaces of the stack holder, said surfaces being separated from each other by a distance equal to the distance between first and second opposite edge portions of said stack;

(b) suspending said stack firmly in place within said slot to cause said first and second stack holder surfaces to be coplanar with respect to said first and second edge portions of said stack;

(c) positioning first and second interconnect carrier sheets over said first and second stack holder surfaces respectively; and (d) simultaneously laminating said first and second interconnect carrier sheets to said first and second surfaces of said stack holder and said first and second edge portions of said stack respectively.

2. The method of claim 1 wherein step (b) is enabled by bolts extending through openings within wall portions of said stack holder and abutting said stack.

3. The method of claim 1 further including (e) thereafter exposing the stack holder having said stack suspended therein to processing fluids for forming conductive interconnects between edge portions of said substrates and whereby said interconnect carrier sheets bonded to said stack holder act as a seal to prevent detrimental exposure of interior portions of said substrates to said processing fluids.

4. The method of claim 3 wherein step (b) is enabled by bolts extending through openings within wall portions of said stack holder and abutting said stack, and wherein said bolts are removed after the performance of step (d) and the bolt openings are covered before performance of step (e) to prevent detrimental exposure of interior portions of said substrates to said processing fluids.

5. The method of claim 1 wherein step (d) is performed by simultaneously applying heat and pressure to said stack holder for bonding said interconnect carrier sheets to the opposite edge portions of said stack.

6. The method of claim 2 wherein step (d) is performed by simultaneously applying heat and pressure to said stack holder for bonding said interconnect carrier sheets to the opposite edge portions of said stack.

7. The method of claim 3 wherein step (d) is performed by simultaneously applying heat and pressure to said stack holder for bonding said interconnect carrier sheets to the opposite edge portions of said stack.

8. The method of claim 4 wherein step (d) is performed by simultaneously applying heat and pressure to said stack holder for bonding said interconnect carrier sheets to the opposite edge portions of said stack.

9. Method of forming a three-dimensional module from a stack of two-dimensional substrates bearing electronic components comprising:

(a) providing a stack holder having a passageway extending between first and second widely separated holder surfaces of the stack holder, said surfaces being separated from each other by a distance substantially equal to the distance between first and second opposite edge portions of said stack;

(b) suspending said stack firmly in place within said passageway to cause said first and second stack holder surfaces to be coplanar with respect to said first and second edge portions of said stack;

(c) positioning first and second interconnect carrier sheets over said first and second stack holder surfaces respectively; and (d) simultaneously laminating said first and second interconnect carrier sheets by the application of heat and pressure to said first and second surfaces of said stack holder and to said carrier sheets positioned upon said first and second edge portions of said stack.

10. The method of claim 9 wherein step (b) is enabled by bolts extending through openings within wall portions of said stack holder and abutting said stack.

11. The method of claim 9 further including (e) thereafter exposing the stack holder having said stack suspended therein to processing fluids for forming conductive interconnects between edge portions of said substrates and whereby said interconnect carrier sheets bonded to said stack holder act as a seal to prevent detrimental exposure of interior portions of said substrates to said processing fluids.

12. The method of claim 11 wherein step (b) is enabled by bolts extending through openings within wall portions of said stack holder and abutting said stack, and wherein said bolts are removed after the performance of step (d) and the bolt openings are covered before performance of step (e) to prevent detrimental exposure of interior portions of said substrates to said processing fluids.

* * * * *